(12) United States Patent
Osaka et al.

(10) Patent No.: US 6,924,651 B2
(45) Date of Patent: Aug. 2, 2005

(54) PRINTED BOARD INSPECTING APPARATUS

(75) Inventors: Hideki Osaka, Oiso (JP); Toyohiko Komatsu, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 409 days.

(21) Appl. No.: 10/212,209

(22) Filed: Aug. 6, 2002

(65) Prior Publication Data

US 2003/0061701 A1 Apr. 3, 2003

(30) Foreign Application Priority Data

Aug. 8, 2001 (JP) .................................... 2001-240078

(51) Int. Cl.[7] .................... G01R 27/28; G01R 31/00
(52) U.S. Cl. .................... 324/628; 324/765; 702/118
(58) Field of Search .................... 438/14–18; 324/537, 324/765, 627, 628; 702/57–59, 64–74, 117, 118

(56) References Cited

U.S. PATENT DOCUMENTS

| | | | |
|---|---|---|---|
| 5,638,402 A | | 6/1997 | Osaka et al. |
| 6,573,801 B1 | * | 6/2003 | Benham et al. ............ 333/24 R |
| 6,611,181 B2 | * | 8/2003 | Marketkar et al. ........ 333/24 R |
| 2003/0057136 A1 | * | 3/2003 | McIntush et al. .......... 208/209 |

FOREIGN PATENT DOCUMENTS

| | | |
|---|---|---|
| EP | 1 011 039 | 6/2000 |
| JP | 8-184842 | 7/1996 |
| JP | 8-203898 | 8/1996 |
| JP | 8-240628 | 9/1996 |
| JP | 2001-27918 | 1/2001 |
| KR | 10-1996-24442 | 7/1996 |
| KR | 10-1998-0003619 | 3/1998 |

* cited by examiner

*Primary Examiner*—Evan Pert
(74) *Attorney, Agent, or Firm*—Mattingly, Stanger, Malur & Brundidge, P.C.

(57) ABSTRACT

A printed board inspecting apparatus includes: an input unit for inputting a pulse from a first signal line; a receiving unit for receiving a voltage induced in a second signal line in response to the input pulse inputted; and a judging unit for judging whether or not a ratio between a voltage of the input pulse and the voltage induced in the second signal line is within a predetermined range. A check is made using a TDR method to determine whether or not the degree of coupling is within a range of specified values and a check is made to determine each of the voltage of the polarized RZ signal and the pulse width time is within a range of specified values to thereby inspect a printed board and a semiconductor chip constituting a bus using a directional coupler.

18 Claims, 8 Drawing Sheets

PRINTED BOARD INSPECTING APPARATUS

BACKGROUND OF THE INVENTION

1. Field of the Invention

The present invention relates to inspection of components (a board and a semiconductor device) constituting a bus to communicate signals between constituent components (e.g., between digital circuits including complementary metal oxide semiconductor (CMOS) elements or between functional blocks thereof) of a multiprocessor, a memory, or the like in an information processing apparatus. In shorts the present invention relates to an inspection method, an inspecting apparatus, and a program product to implement the inspection method by a computer.

The present invention further relates to a bus system including a board inspected by the board inspecting apparatus and semiconductor devices inspected by a semiconductor device inspecting apparatus, and semiconductor and semiconductor devices inspected by a semiconductor device inspecting apparatus. The present invention also relates to a manufacturing method and a manufacturing system using results of the inspection.

2. Description of Related Art

Bus systems connected to a large number of nodes-to transfer data at high speed, have been proposed as a non-contact bus wiring described in U.S. Pat. No. 5,638,402, a gap coupled bus described in EP1011039, a directional coupled bus system described in U.S. Pat. No. 09/429,441, the content of which is incorporated herein by reference, and a directional coupled bus system described in JP-A-2001-027918. FIG. 2 shows a basic system of the non-contact bus wiring described in U.S. Pat. No. 5,638,402.

In this technique, data transfers conducted between two nodes using a crosstalk generator or a directional coupler are carried out as follows. That is, data transfer between a bus master 10-1 and a slave 10-2 and data transfer between the bus master 10-1 and a slave 10-3 are respectively conducted using crosstalk between terminated wiring 1-1 and terminated wiring 1-2 and crosstalk between terminated wiring 1-1 and terminated wiring 1-3. This is suitable for data transfer between one node and a large number of nodes, e.g., between the bus master 10-1 and the slaves 10-2, 10-3. That is, the technique is suitable for data transfer between memories and a memory controller. To manufacture the bus system for users, each component of the system must be inspected.

Such components constituting a bus with use of the directional coupler mainly include a board and semiconductor devices, conventionally, these components have been inspected as follows.

(1) In manufacturing of the board, a wiring conduction check is made to detect disconnection in wiring patterns or any wrong connections between wiring lines. FIG. 6 schematically shows a "dc check".

On a board 1, wiring is arranged to electrically connect components to be mounted on the board 1. FIG. 6 representatively shows wiring 1-a and wiring 1-b. Conventionally, a conduction/short-circuit check is used to inspect the board. The wiring 1-a and the wiring 1-b are different signal wiring lines. Pads for connecting the devices are respectively disposed on the wiring 1-a and wiring 1-b, represented by A, B, C, and D, respectively.

To check conduction of the wiring on the board of the wiring 1-a, a conduction check may be made between the pads A and B. Ordinarily, metallic check probes 7-1 and 7-2 are respectively connected to the pads A and B to measure resistance between the check probes 7-1 and 7-2. In the conduction check of the wiring 1-b, check probes 7-3 and 7-4 are similarly connected to the pads C and D to measure resistance between the check probes 7-3 and 7-4.

To inspect the board 1 for any connection between the wiring lines 1-a and 1-b to check a short, a check is made for connection between the pad A or B and the pad C or D. If the check results in high impedance, the wiring lines 1-a and 1-b are not connected to each other.

In this way, the inspection of the board 1 during the production is conducted using the check probes 7-1 to 7-4. That is, the check is made to detect a short-circuit or connection between the pads of the same signal wiring and to detect an open state or disconnection between the pads of the different signal wiring. The connection-disconnection check uses a low-frequency current or a direct current (dc) and is hence called a "dc check".

(2) In the manufacturing process of digital data transfer semiconductor devices, an inspection of the devices is conducted to select acceptable devices before the devices are delivered to users. For the verification, a non-return to zero (NRZ) signal is used. In operation of the digital device inspecting apparatus, the apparatus is directly connected by wiring to a chip and connection therebetween is inspected by a binary signal (NRZ signal). In the inspection of a core circuit of the chip, flip-flop circuits therein are scanned by a particular signal. This is also called a boundary scanning method.

SUMMARY OF THE INVENTION

A first problem arises in that since the wiring conduction check is carried out using a direct current or a low-frequency current, there exists a portion which cannot be inspected in this method in the directional coupled bus shown in FIG. 2. The portion corresponds to a directional coupler depending on a degree of coupling. The directional coupler is made up of two parallel wiring lines which are separate from each other. The dc test cannot inspect the degree of coupling therebetween. An object of the present invention is to inspect the degree of coupling.

A second problem is as follows. Since NRZ signals are used to verify a semiconductor device to transfer digital data, functions of the digital devices can be inspected by checking the devices conventionally. However, a semiconductor device connected to a directional coupler to communicate data includes a hysteresis function in its receiver circuit. Such an input circuit having a hysteresis function cannot be inspected by inputting NRZ signals thereto for the following reasons. An inspecting apparatus using binary NRZ signals cannot inspect 3-value RZ signals. A second object of the present invention is to inspect a semiconductor device having a hysteresis function.

A third problem is as follows. A semiconductor device of which the hysteresis characteristic has not been inspected is mounted on a board in which undesired conduction and disconnection (opening) are absent in and between wiring thereof and in which an amount of signals generated by a directional coupler is unknown since its degree of coupling has not been inspected. Therefore, its operational characteristic becomes unstable. A third object of the present invention is to provide a product in which a semiconductor device having a fixed hysteresis characteristic is mounted on a board having a fixed degree of coupling of the directional coupler and the product resultantly has a stable operational characteristic.

To solve the first problem according to the present invention, a pulse signal is inputted via a first signal line of the directional coupler such that a voltage induced on a second signal line of the directional coupler according to the input pulse signal is obtained and a voltage of the input pulse signal is compared with the voltage induced on the second signal.

To solve the second problem, an object of the inspection of the semiconductor device having the hysteresis function is divided into an input/output (I/O) section and a core logic section. In the verification of the core logic section, the receiver is operated in an NRZ mode to verify a core logic via a hysteresis receiver to select good products. For the good products having passed the inspection, the hysteresis receiver is operated in an RZ mode to inspect the RZ mode of the I/O section.

To solve the third problem, the semiconductor device inspected as above is mounted on the board thus inspected to thereby provide a bus system having a stable operation characteristic.

Other objects, features and advantages of the invention will become apparent from the following description of the embodiments of the invention taken in conjunction with the accompanying drawings.

DESCRIPTION OF THE EMBODIMENTS

Figure 1:
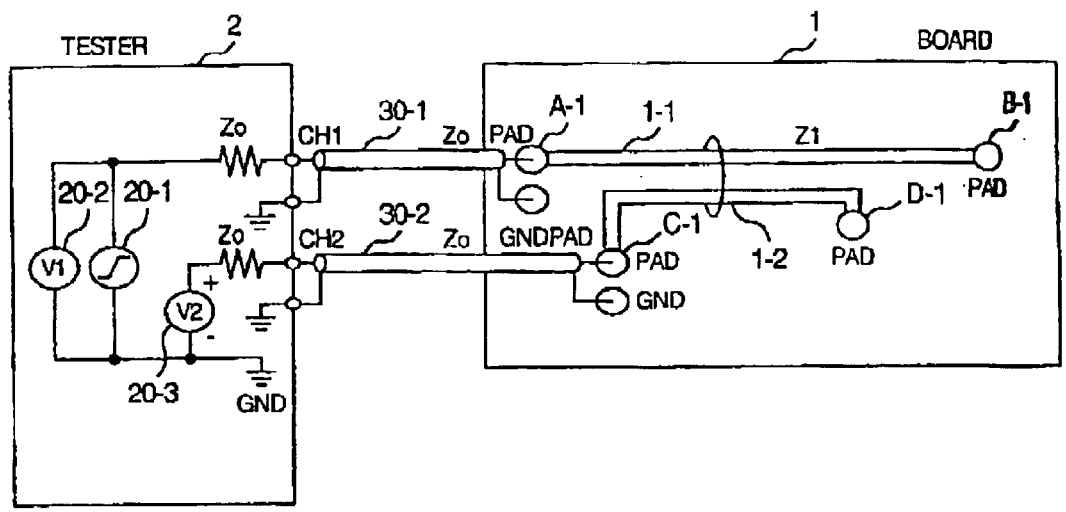
FIG. 1 is a diagram showing a configuration of an inspection apparatus and a board in a first embodiment of the present invention.

Description will now be given of a first embodiment of the present invention by referring to FIG. 1.

The configuration is an embodiment to inspect a degree of coupling of a directional coupler formed in a board. Therefore, the board has passed the dc check described in conjunction with the related art.

Figure 2:
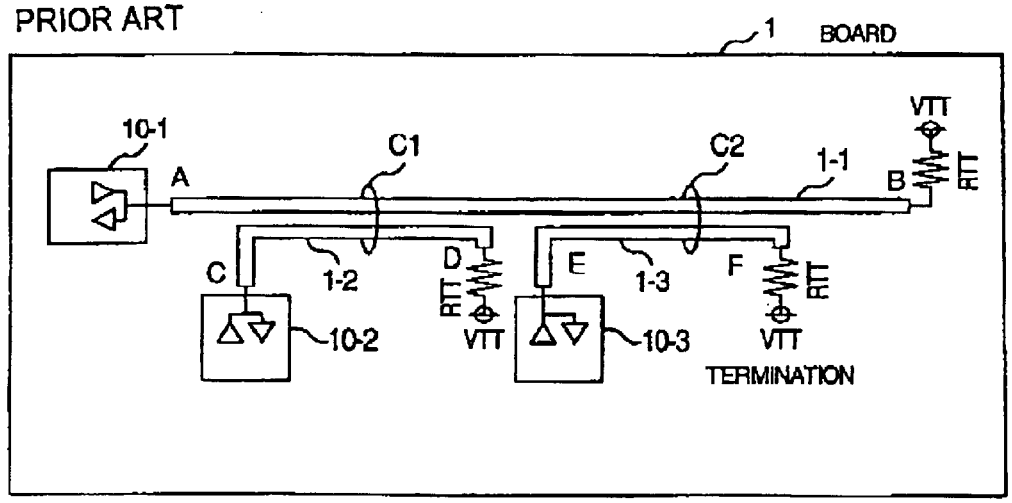
FIG. 2 is a diagram showing a configuration of an inspection apparatus of the prior art.

Numeral 1 indicates a board including a directional coupler to be inspected. Numeral 2 is an inspecting apparatus or a tester to check the board 1. A large number of wiring lines having a directional coupler shown in FIG. 2 are formed in the board 1. FIG. 1 shows only wiring associated with the directional coupler. Reference numeral 1-1 is main coupling wiring to form a directional coupler having pads A-1 and B-1 on respective ends. Reference numeral 1-2 is subordinate coupling wiring to form the directional coupler having pads C-1 and D-1 on respective ends.

The tester 2 has at least two testing terminals called channel 1 (CH1) and channel 2 (CH2). The channels 1 and 2 are connected respectively via cables 30-1 and 30-2 to the directional coupling in the board 1. The cables 30-1 and 30-2 are ordinarily coaxial cables having a wide band and fixed characteristic impedance. The characteristic impedance is substantially equal to internal impedance Zo of the tester 2. Viewed from the channels 1 and 2, internal impedance of the tester 2 has also a wide band and is substantially fixed.

The tester 2 conducts a test as follows to determine whether or not a coupling coefficient of the directional coupler in the board 1 is within a predetermined range.

The channel 1 outputs a rectangular pulse signal having a short rising time. A response thereto is observed by the voltage monitor 20-2 disposed in the tester 2. The function is equal to that of a digital oscilloscope having a time domain reflectometry (TDR) function. Reference numeral 20-1 indicates a pulse source having a high transition speed. By using a negative resistance diode, the pulse source 20-1 can output a pulse signal having a rising time of about 40 picoseconds (ps). The signal pulse produced from the pulse source 20-1 is called "TDR pulse".

The channel 2 incorporates a voltage monitor 20-3 in the tester 2. When a voltage is monitored at timing synchronized with an output of the TDR pulse, the voltage waveform observation of the channel 2 is called "time domain transmissometry (TDT) observation".

The cables 30-1 and 30-2 are respectively connected to ends of the wiring 1-1 and 1-2 constituting the directional coupler. The cable 30-1 is connected to the channel 1 and the pad A-1 of the wiring 1-1. Ground of the cable 30-1 for a signal return current is also connected to GND PAD in the vicinity of the pad A-1. Similarly, the cable 30-2 connected to the channel 2 is connected to the pad C-1 of the wiring 1-2. Ground of the cable 30-2 for a signal return current is connected to GND PAD in the vicinity of the pad C-1.

The directional coupler has directionality in signal propagation. A signal is generated in a direction opposite to a direction where a signal is propagated through the main coupling wiring. In FIG. 1, a TDR pulse inputted from the pad A-1 of the wiring 1-1 generates a signal on the pad C-1 side of the subordinate coupling wiring 1-2, the pad C-1 side being the nearer end of the directional coupler to the pad A-1. Therefore, the channel 2 is connected to the end of pad C-1 via the cable 30-2, the end of pad C-1 being the nearer end.

The end of pad B-1 of the wiring 1-1 and the end of pad D-1 of the wiring 1-2 are open ends. The signal totally reflects on the ends of pads B-1 and D1.

To inspect the directional coupler with respect to the design, observation must be conducted to determine whether or not characteristic impedance Z1 of the main coupling wiring and the signal induced on the subordinate coupling wiring are within specified values, respectively.

Figure 3:
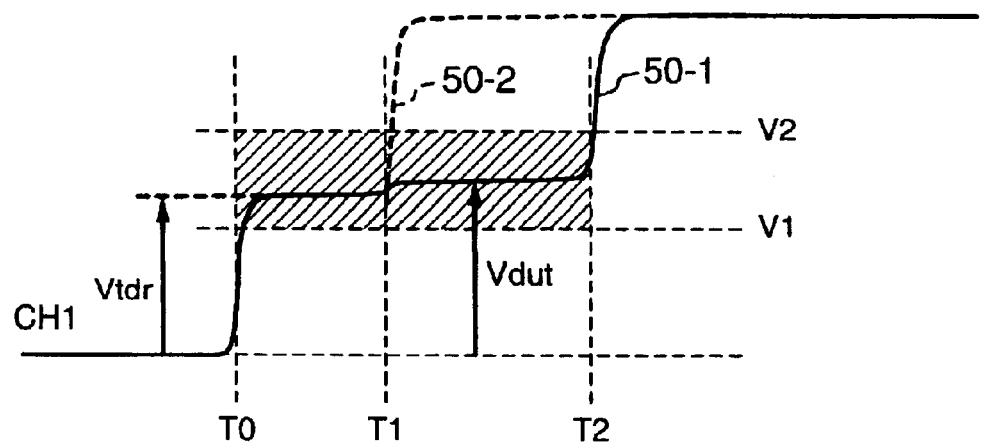
FIG. 3 is a graph showing a voltage measured by a voltage monitor 20-2 and a specified value of the voltage.

Referring to FIG. 3, description will be given of the inspection to determine whether or not the characteristic impedance Z1 of the wiring 1-1 is within a range of predetermined values. FIG. 3 shows a voltage observed by the voltage monitor 20-2 and a specified value thereof ma graph. A solid line 50-1 is a TDR voltage waveform (dut) of the wiring 1-1 observed by the voltage monitor 20-2. A broken line 50-2 is a waveform observed when the cable 30-1 is connected via its one end to the channel 1 and the other end of the cable 30-1 is open.

The TDR pulse with voltage Vtdr is inputted to the board connecting pad A-1 of the cable 30-1 at time T1, and a reflected wave thereof returns after a lapse of time T2 at which the pulse passes through the wiring 1-1 and returns from the other end as pad B-1 of the wiring to the pad A-1. The characteristic impedance Z1 of the wiring 1-1 is determined by voltages respectively at the points of times T1 and T2.

Assuming that the characteristic impedance of the wiring 1-1 is Z1 in response to the characteristic impedance Zo, the following expression (1) is given.

$$Vdut=Vtdr*(Z1-Zo)/(Z1+Zo) \qquad (1)$$

where Vtdr is an input voltage and Vdut is a reflection voltage. Assuming that a voltage reflection coefficient is expressed as Γ. The impedance Z1 is obtained from expressions (2) and (3), as follows.

$$\Gamma=Vdut/Vtdr \qquad (2)$$

$$Z1=Zo(1+\Gamma)/(1-\Gamma) \qquad (3)$$

Expression (3) indicates that the impedance can be obtained according to a ratio between the input voltage and the reflection voltage.

Specified values Z11 and Z12 required for determining the characteristic impedance Z1 of the wiring 1-1. are given by an expression (4), as follows.

$$Z11<Z1<Z12 \qquad (4)$$

Assigning that the expression (4) is substituted for the expression (1), the voltage Vdut is given by expressions (5) and (6) as follows.

$$Vdut(Z11)=Vtdr*(Z11-Zo)/(Z11+Zo)V1 \qquad (5)$$

$$Vdut(Z12)=Vtdr*(Z12-Zo)/(Z12+Zo)V2 \qquad (6)$$

In the expressions (5) and (6), the voltage Vdut for the specified value Z11 is defined as a voltage V1 and the voltage Vdut for the specified value Z12 is defined as a voltage V2. During a period of time ranging from T1 to T2, if an observed voltage Vdut 50-1 exists between V1 and V2, the condition of the specified values is satisfied. In FIG. 3, the range of the specified values is indicated by a hatched area. This hatched area is referred to as a "mask." In this way, if the observed waveform 50-1 is within the mask indicated by the hatched area, the wiring 1-1 satisfies the condition of the specified values with respect to the characteristic impedance.

Figure 4:
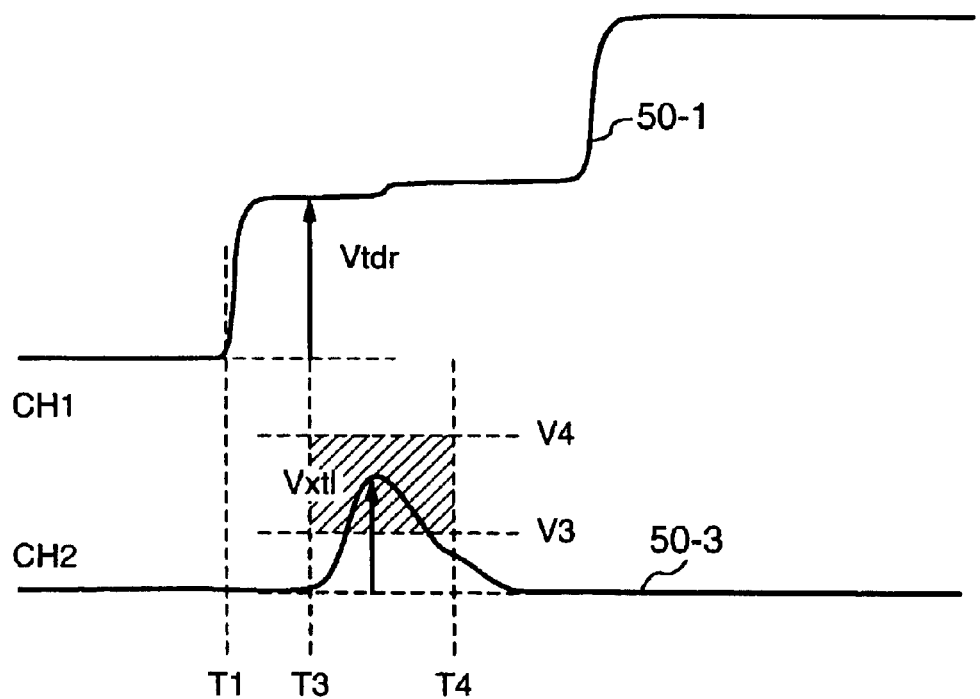
FIG. 4 is a graph showing a waveform of the voltage monitor 20-2 of CH1 and a waveform of a voltage monitor 20-3 of CH2.

Referring to FIG. 4 description will be given of a method of inspecting the degree of coupling of the directional coupler constructed in the board 1.

FIG. 4 shows waveforms 50-1 and 50-3 respectively of the voltage monitors 20-2 and 20-3 of the channels 1 and 2, respectively. For the degree of directional coupling in the directional coupler, the specified values of the degree of coupling are indicated by a signal voltage and a signal time width. The mask is shown by a hatched rectangle. Specifically, the rectangle of the mask is representatively shown using four points corresponding to voltages V3 and V4 and points of time T3 and T4. Assuming that the degree of coupling of the directional coupler is represented by a coupling coefficient kb, the following relation is given by an expression (7).

$$Vxtl=Kb*Vtdr \qquad (7)$$

where Vxtl is a peak voltage of the voltage waveform 50-3 of the channel 2. That is, the degree of coupling Kb is represented by a ratio between the input voltage Vtdr of the wiring 1-1 and the induced voltage Vxtl of the wiring 1-2. The ratio is therefore inspected for the degree of coupling.

The voltages V3 and V4 determine the degree of coupling given by an expression (8) as follows.

$$V3<Vxtl<V4(T3<T<T4) \qquad (8)$$

where T is a point of time at which the peak voltage appears in the voltage 50-3 (Vxtl). If the observed voltage 50-3 is less than the voltage V3, the degree of coupling is not satisfied. Conversely, if the voltage 50-3 is more than the voltage V3, the degree of coupling is too large. The time T3 is a quantity determined by a positional relationship between the main coupling line 1-1 and the subordinate coupling line 1-2. The time T4 is a quantity determined by a propagation delay time in which a signal goes from a first end of the directional coupler to a second end and comes back therefrom to the first end. Specifically, the time T4−T3 is substantially equal to the propagation delay time of the to and fro. The times T3 and T4 determine a time zone to inspect the observed voltage 50-3.

Generally, a printed board is manufactured by a method using electrolytic plating. However, because of a characteristic of the electrolytic plating, the wiring width possibly becomes smaller or greater with respect to the cross section. In the case of the directional coupler, deviation of the wiring width is greater than deviation of the pitch of two wiring. The pitch is determined by mechanical precision in the exposing process of resist formed before the plating process and is considerably smaller than the deviation caused by the plating in the wiring width in ordinary cases. Therefore, when the wiring width becomes wide, the distance between two wiring on the surface becomes smaller and the coupling coefficient becomes greater. In this case, the inspection can be detected with a result that the peak voltage Vxtl of the observed waveform 50-3 exceeds the voltage V4. Similarly, when the wiring width becomes narrow, the coupling coefficient becomes smaller and the voltage Vxtl becomes less than the voltage V3.

In this way, to inspect the characteristic impedance and the coupling coefficient of the directional coupler configured in the printed wiring board 1, the tester 2 has the functions of the TDR and TDT methods, and the judgement to determine whether or not each of the characteristic impedance and the coupling coefficient is within a range of specified values, can be conducted by setting voltages and time as above.

In the method of the embodiment, one TDR pulse is applied to the wiring to obtain the characteristic impedance Zo and the degree of coupling Kb of the directional coupler. However, it is possible to simultaneously apply in-phase pulses having the same voltage or out-of-phase pulses having the same absolute value respectively from the cables 30-1 and 30-2 of FIG. 1 to the wiring. In this case, a common-mode pulse and a differential-mode pulse of differential lines are applied to the wiring. By obtaining a reflection coefficient for each of these pulses, impedance can be determined for each of the common and differential modes, thereby representing Zc and Zd for each impedance of the common mode and the differential mode, respectively. The impedance Ze of the line to be inspected is then represented by an expression (9) and the coupling coefficient Kb is represented by an expression (10). Each of these values should be within the range of specified values. This is judged in the following method.

$$Ze=SQRT(Zc*Zd) \quad (9)$$

$$Kb=\tfrac{1}{2}((4*Zc-Zd)/(4*Zc+Zd)) \quad (10)$$

The characteristic impedance and the coupling coefficient can be inspected by applying two in-phase pulses or two out-of-phase pulses as above.

In the embodiment, to inspect the degree of coupling, the characteristic impedance and the coupling coefficient are obtained by observing voltages in the time zone. However, the characteristic impedance and the coupling coefficient can also be obtained in a frequency range. That is, by using the voltage source 20-1 in the tester 2, a sine wave of a predetermined frequency is outputted from the channel 1. A voltage induced on the wiring 1-2 is then fed to the channel 2 to be able to measure and obtain the coupling coefficient. The frequency may be selected such that the subordinate coupling line of the directional coupler is, for example, λ, ½λ, or ¼λ to set a transmission mode.

As a directional coupler in the board 1, the directional coupler may be incorporated in circuits in a practical product, or may also use a specific wiring for the inspection. To measure the degree of coupling, the specific wiring may be preferably arranged for the inspection. This prevents the wiring from environmental influence, and hence the inspection can be achieved with higher precision.

Figure 5:
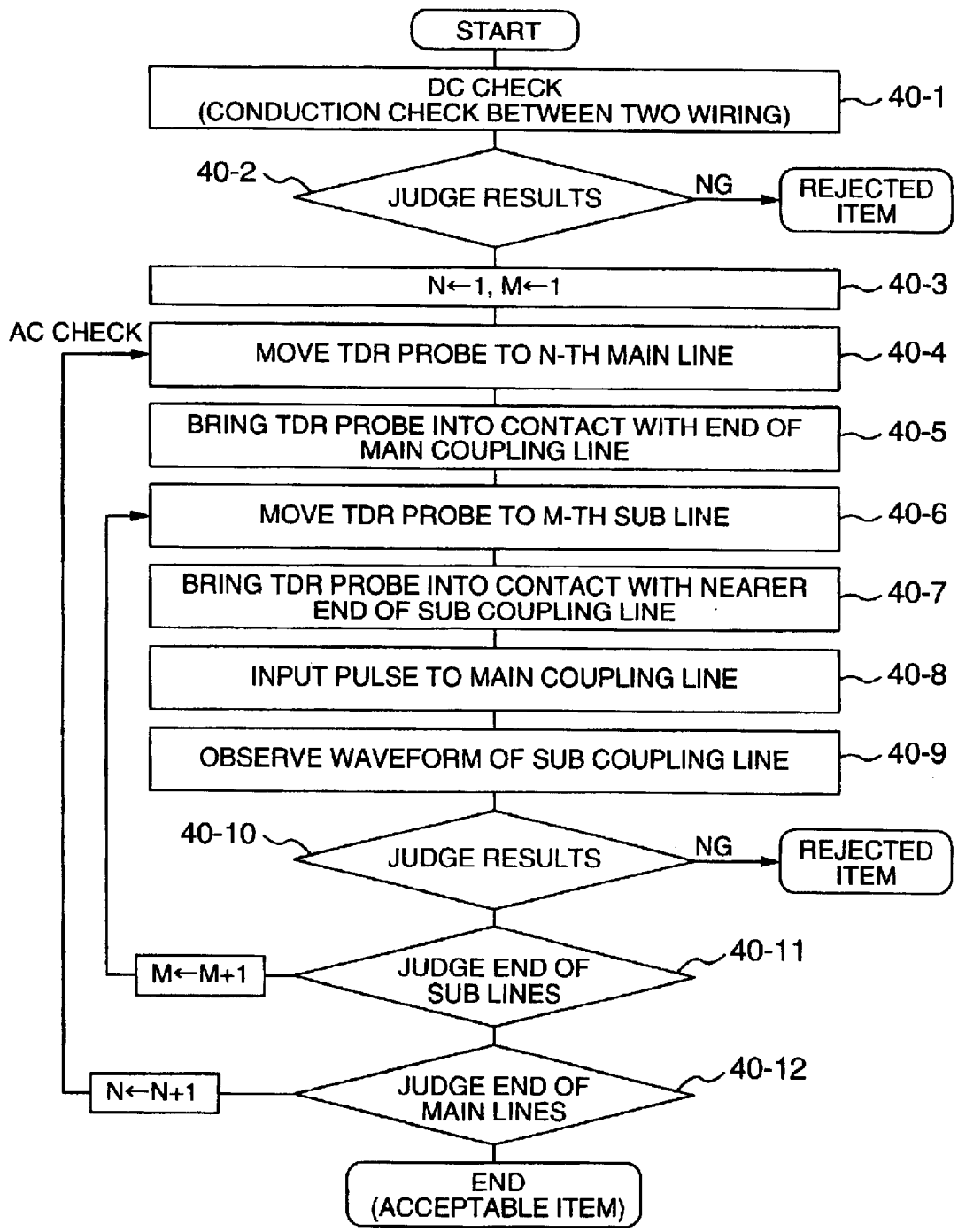
FIG. 5 is a flowchart showing a board measuring procedure.
Figure 6:
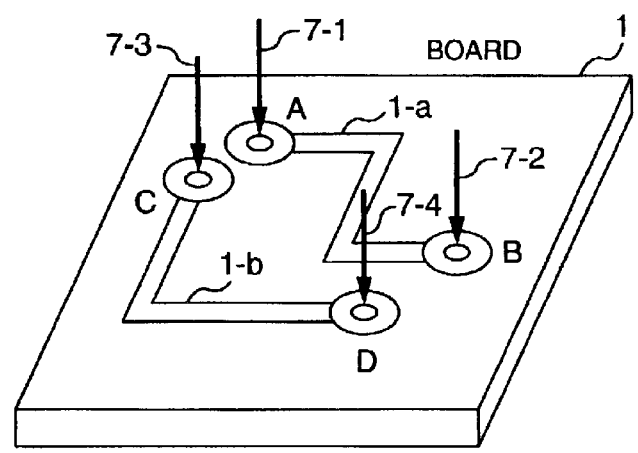
FIG. 6 is a schematic diagram to explain a dc check.

Referring now to FIG. 5, description will be given of a procedure of inspecting the board.

In the board inspection or test of a wiring pattern, the dc test is carried out to determine that the wiring pattern is conductive and to determine that the wiring pattern is not connected to any other wiring pattern. In the dc test, a conduction test is conducted at both ends of the main coupling line of the directional coupler as well as both ends of the subordinate coupling line of the directional coupler and an open-circuit test or open test is conducted between the main and subordinate coupling lines.

In a step 40-2, results of the tests are judged to determine whether the item is rejected or accepted. If the item is accepted, the control goes to a step 40-3. Subsequent steps beginning at the step 40-3 are to check the characteristic impedance and the degree of coupling of the directional coupler. To test a plurality of directional couplers, the tester 2 first sets resisters N and M to "1" (the step 40-3). These registers are temporary storages in the tester 2 and respectively indicate numbers of directional couplers. In a step 40-4, another end of the cable 30-1 connected to the channel 1 is moved to a pad position of main line stored in register N. Assuming that the end connected to the main line of the cable 30-1 is called "TDR probe," the movement may be mechanically or manually conducted.

In a step 40-5, the TDR probe is connected to an end of the N-th main line. The value of the register N is associated with the "N-th main line". In a step 40-6, another end (to be called "TDT probe" hereinbelow) of the cable 30-2 connected to the channel 2 is moved to the M-th subordinate coupling line. In a step 40-7, the TDT probe is connected to the end of the subordinate coupling line.

In a step 40-8, the tester 2 inputs a TDR waveform to the N-th main line from the TDR probe connected to the channel 1 and then observes a reflection wave thereof. In a step 40-9, the tester 2 also observes the TDT waveform of the channel 2. In a step 40-10, the tester 2 judges whether each of these waveforms is within a range of the specified values shown in FIGS. 3 and 4.

If NG (or no good) results, i.e., if the item is rejected, the control goes to a step 40-11. In this step, if the N-th main line has a plurality of subordinate coupling lines, the tester 2 judges whether or not the test has been conducted for all of the subordinate coupling lines. If there exists any subordinate coupling line to be tested, one is added to the value of register M and control returns to the step 40-6 to continue the test. If the test has been finished for all subordinate coupling lines, the control goes to a step 40-12. In this step, the tester 2 judges whether or not the test has been conducted for all main lines. If there exists any main line to be tested, one is added to the value of register N and control returns to the step 40-4. If the test has been finished for all main lines, the test is finished. The item thus tested is regarded as an acceptable product.

In the procedure described above, all directional couplers are tested. However, a sampling inspection may be conducted by selecting samples from the directional couplers to resultantly determine acceptable boards. Whether or not the sampling inspection is used is determined according to a relationship between the deviation in the products and yield.

As a result of the board selection, there can be prepared boards each of which includes a directional coupler having a fixed degree of coupling.

Figure 7:
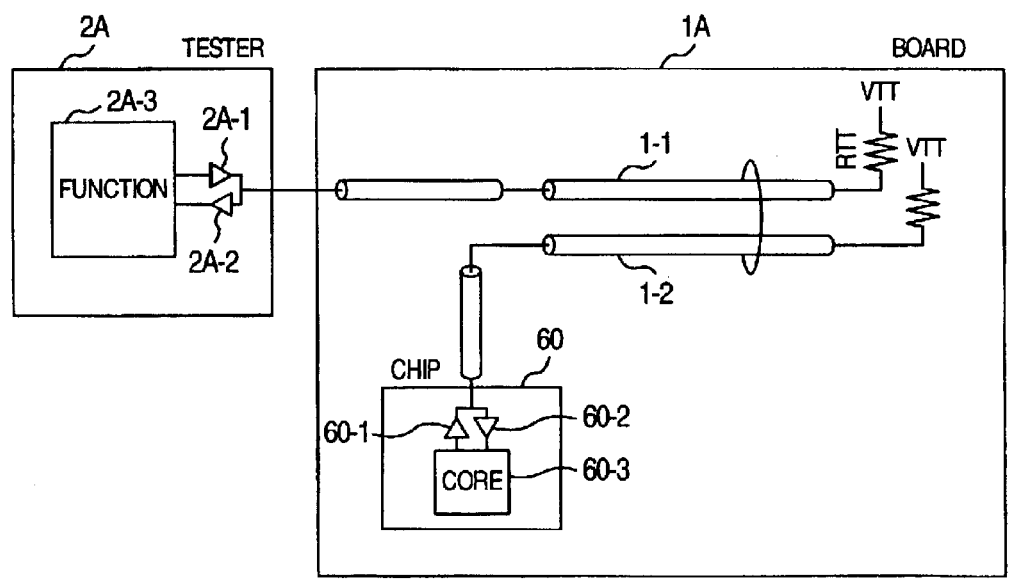
FIG. 7 is a diagram showing a configuration of an inspection apparatus and a board in a second embodiment of the present invention.

Referring to FIG. 7, a second embodiment will be described.

The second embodiment is associated with inspection of a semiconductor element connected to a bus using a directional coupler.

In FIG. 7, a numeral 60 is a semiconductor element or chip to be tested. Reference numeral 2A indicates a tester. A reference numeral 1A is a printed board on which the chip 60 is mounted to transmit a test signal to the chip 60.

The chip 60 contains an input circuit 60-2 and an output circuit 60-1 to transfer data via a bus using a directional coupler and an internal core circuit 60-3 to provide functions via the input and output circuits 60-2 and 60-1. The core circuit means a circuit as a whole except for an externally located circuit and a signal input and output circuit. In this embodiment, the output circuit 60-1, the input circuit 60-2, and the core circuit 60-3 are inspected.

The input circuit 60-2 has a hysteresis characteristic function. That is, the input circuit 60-2 has a function to sense a return to zero (RZ) signal. One object of the embodiment is to conduct a test to determine whether or not the function is produced in a range of specified values.

In the embodiment, the tester 2A contains an output circuit 2A-1, an input circuit 2A-2, and a function test circuit 2A-3. The tester 2A tests the chip 60 via, the board 1A. A directional coupler is formed in the board 1A. A main coupling line is indicated by 1-1 and a subordinate coupling line is indicated by 1-2. One end of each of the wiring lines 1-1 and 1-2 is connected to a power source with matching termination. The directional coupler generates a signal shown in FIG. 8 using a rectangular pulse signal.

Figure 8:
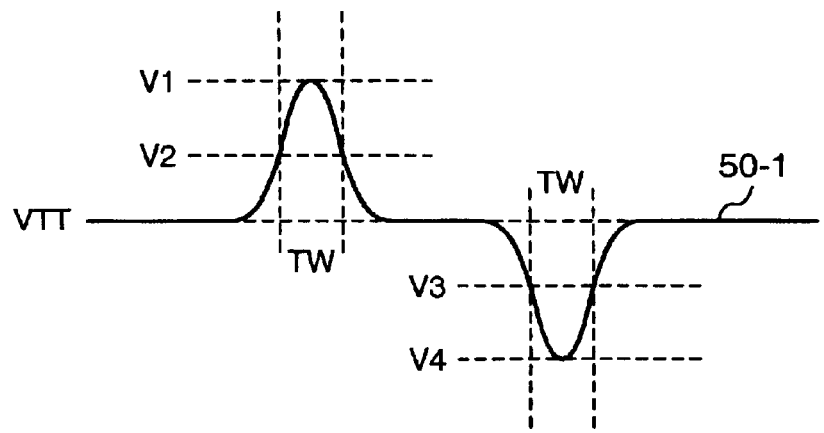
FIG. 8 is a graph showing a rectangular pulse generated by a directional coupler.

As can be seen from FIG. 8, the coupler generates a positive pulse and a negative pulse with respect to a termination voltage VTT. Assuming that the positive pulse has a peak voltage V1, a half-voltage V2, and a half-width TW at V2, similarly the negative pulse has a peak voltage V4. a half-voltage V3, and a half-width TW at V3.

The output circuit 2A-1 of the tester 2A can precisely control V1, V4, and TW using the board 1A. For example, assuming that the directional coupler including the wiring 1-1 and 1-2 in the board 1A has strictly determined characteristics, when the board 1A is used, the output circuit 2A can control V1 and V4 by controlling a rise time and a signal amplitude. When the signal amplitude is increased, V1 and V4 are increased in proportion thereto. When the rise time is reduced, the pulse has accordingly a sharper form. TW is determined by the propagation delay time of the directional coupler. However, when the rise time is elongated, TW also becomes longer.

Whether or not the input circuit 60-2 in the chip 60 normally functions can be tested by using the function. For example, when the boundary scan is used, the pulse waveform shown in FIG. 8 is inputted to the input circuit 60-2 such that an output result from the input circuit 60-2 is kept by a flip-flop circuit. The output result in the flip-flop circuit is obtained by the boundary scan to be compared with an expected value.

If the boundary scan is not used, the test may be conducted as follows when the chip 60 is a memory. The tester conducts a write operation in the chip 60. The tester issues a write command to write data at a specified address. The tester then reads data from the chip 60 using the same address. If the read data thus obtained is equal to the expected value. i.e., the write data, the chip 60 is regarded as normal, that is, the item is an acceptable product. In this case, the test is conducted for the overall chip. However, if there exists any defect, this test cannot determine the position of the defect.

It is also possible in the write and read operations to measure a margin by slightly changing each of the voltages and the time width shown in FIG. 8. By testing the chip 60 using the changed voltages and time width, an operation range of the chip 60 can be determined. That is, specifications to be satisfied by the chip 60 can be tested with a margin.

Even if the chip 60 is a large scale integration (LSI) chip for a processor or a memory controller, the tester 2A can inspect the chip 60. That is, the tester 2A sends a signal to the chip 60 and monitors a signal sent from the chip 60 in response thereto. A value of the monitored signal is compared with an expected value.

The output circuit 60-1 of the chip 60 can also be tested in this method. The boundary scan is conducted for the chip 60 to obtain data or the chip 60 is operated to output data. The tester 2A compares the data with an expected value. The tester 2A receives a signal via a directional coupler. Therefore, by checking a peak voltage and a time width of a waveform of the signal, the tester 2A can judge whether or not the output circuit 60-1 is in a range of specified values.

By using only one tester 2A shown in FIG. 7, the input circuit 60-2, the output circuit 60-1, and the core circuit 60-3 can be inspected. The tester 2A can also be used to test only the input circuit 60-2.

As described above, when the conventional digital semiconductor tester is used, the tester is directly connected to a semiconductor device or chip to test the chip using an NRZ signal. It is also possible that the conventional tester is used to test the output circuit 60-1 and the core circuit 60-3 and the tester shown in FIG. 7 is used to test the input circuit. The tests can be concurrently carried out and hence the total test time is reduced.

Figure 9:
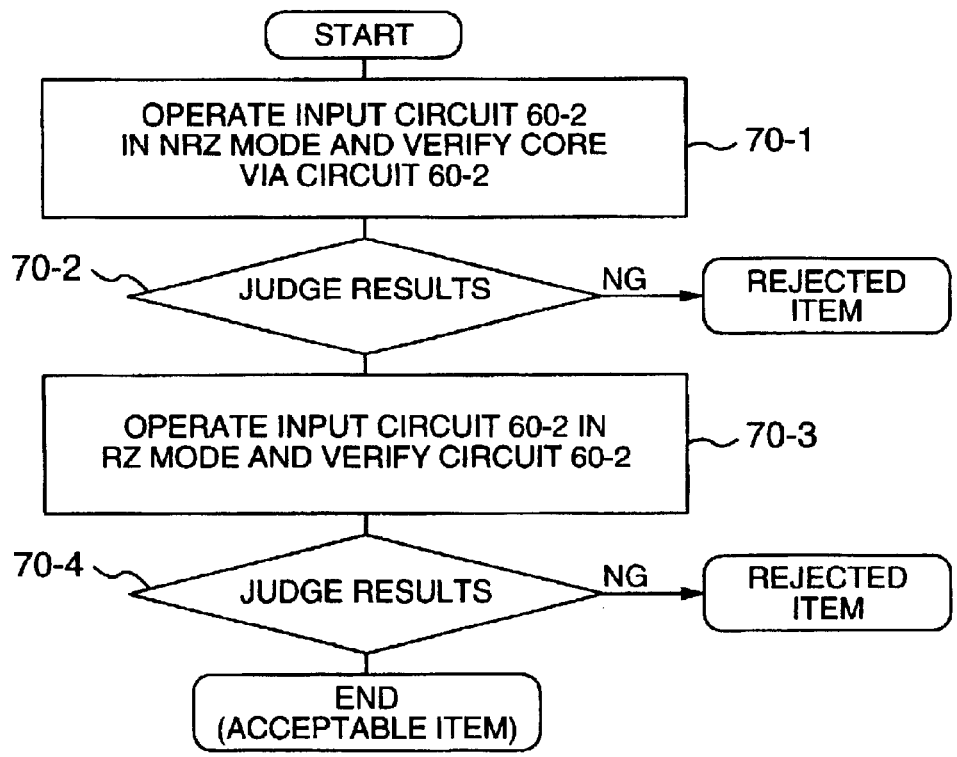
FIG. 9 is a flowchart showing a procedure of measurement of a semiconductor device.

Referring now to FIG. 9, description will be given of the test procedure to test the chip 60.

The test procedure has an object to reduce the total test time by separately conducting the verification of the core circuit 60-3 and that of the input circuit 60-2. In the verification of the core 60-3, the chip 60 is mounted on the conventional NRZ signal tester and the input circuit 60-2 in the chip 60 is set to the NRZ mode. The core circuit is tested via the input circuit 60-2 (a step 70-1). Whether or not the core circuit is acceptable or rejected is judged (a step 70-2). If the core is acceptable, the control goes to a step 70-3. In this connection, the input circuit 60-2 is set to the NRZ mode as follows.

When an NRZ signal of a voltage equal to or more than a voltage necessary for the test is inputted to the input circuit 60-2 as a hysteresis receiver, the input circuit 60-2 operates as an NRZ receiver for the following reasons. That is, the NRZ signal can intersect two threshold voltages of the input circuit 60-2. In short, when an NRZ signal having large amplitude is inputted to the input circuit 60-2, the input circuit 60-2 operates as an NRZ input circuit. This is referred to as "the input circuit is set to the NRZ mode". If the core is acceptable in a step 70-2, the control goes to a step 70-3.

In the step 70-3, the input circuit 60-2 is set to the RZ mode. This means that the chip 60 of which the hysteresis characteristic is to be tested is installed in the tester showing in FIG. 7. In FIG. 7, an output from the tester 2A is fed to the board 1A. As a result, a signal shown in FIG. 8 is inputted to the chip 60. In step 70-3, the input characteristic of the input circuit 60-2 is tested by changing the voltages V1 and V4 and the time Tw as described above. Each result outputted from the input circuit 60-2 is compared with an expected value to judge the input circuit 60-2 for an acceptable product or a rejected product in step 70-4.

The test is conducted in two phases by the tester using the NRZ signal and the tester using the RZ signal to resultantly reduce the teat time.

Figure 10:
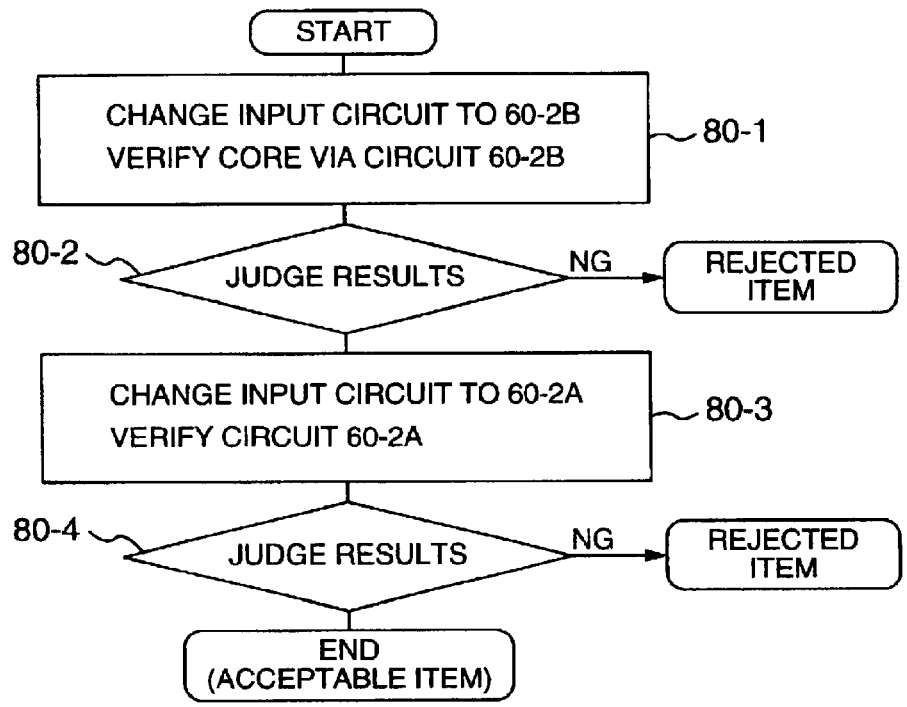
FIG. 10 is a flowchart showing a procedure of measurement of a semiconductor device including an NRZ signal input circuit and a hysteresis input circuit for RZ signal.

Referring to FIG. 10, description will be given of another inspecting procedure.

The test procedure shown in FIG. 10 has a purpose to test a semiconductor device including an NRZ signal input circuit such as a stub series terminated logic (SSTL) and a hysteresis input circuit for an RZ signal.

Figure 11:
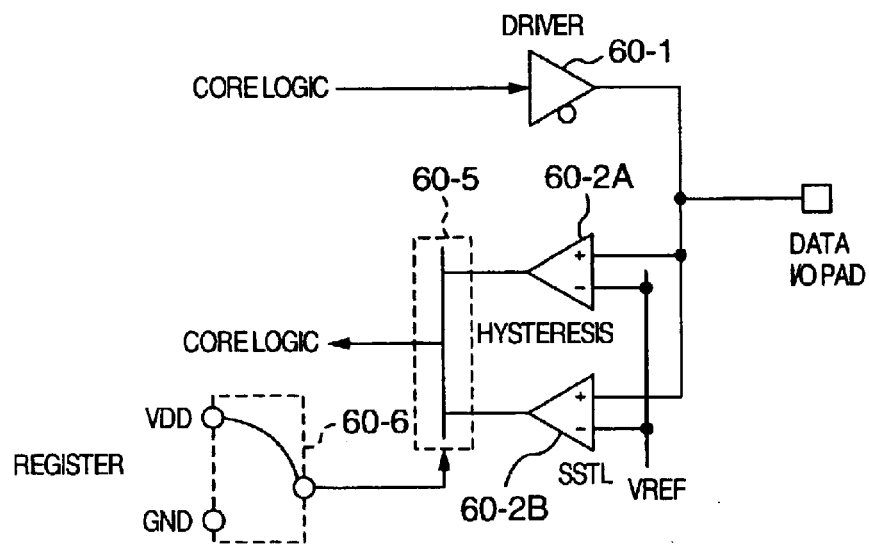
FIG. 11 is a diagram showing an input/output circuit in a chip 60.

The test is used when the chip 60 to be tested includes an input circuit of a circuit configuration as shown in FIG. 11. The input circuit of FIG. 11 will be first described.

FIG. 11 shows an input/output circuit in the chip 60. The input/output circuit has a function to conduct a change-over operation between input circuits. That is, the circuit includes an input circuit 60-2A having a hysteresis function for connection to a bus using a directional coupler and an input circuit 60-B to receive an NRZ signal. The input circuit 60-B for an NRZ signal operates according to, for example, an SSTL interface. The change-over between the input circuits 60-A and 60-B is conducted by a unit 60-5. The unit 60-5 can be operated by an internal register 60-6 for the change-over.

Returning to FIG. 10, the processing will be described.

In a step 80-1 to verify the core 60-3, the chip 60 is installed on the conventional NRZ signal tester and operation is changed from the input circuit 60-2A to the input circuit 60-2B. The core function 60-3 is tested using the receiver.

A check is made to determine whether or not the tested item is acceptable or not (a step 80-2). If acceptable, the control goes to a step 80-3. The system is set to the RZ mode and operation is changed to the hysteresis receiver 60-2A in the chip 60. To set the RZ mode means that the chip 60 is set to the tester of FIG. 7 to test the hysteresis characteristic.

In the step 80-3, the voltages V1 and V4 and the time Tw are changed as described above and are inputted such that each result is compared with an expected value. Results obtained in step 80-3 are checked to determine whether or not the tested item is acceptable.

In this way, the test can be conducted for a chip including an NRZ signal input circuit such as an SSTL and a hysteresis input circuit for an RZ signal.

Figure 12:
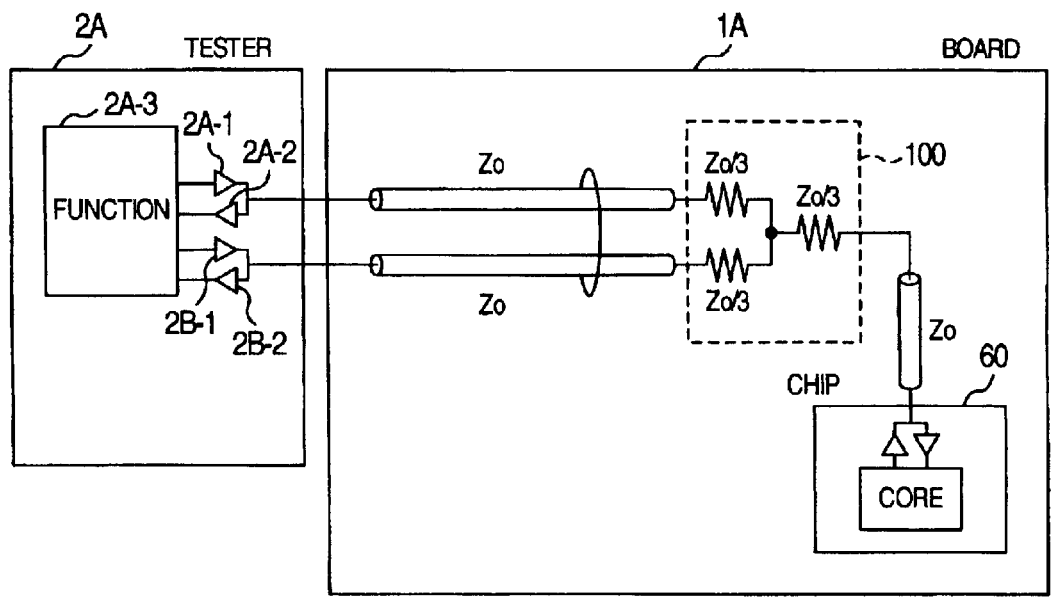
FIG. 12 is a diagram showing a circuit to generate the pulse shown in FIG. 8.

Referring to FIG. 12, description will be given of another embodiment in conjunction with the pulse generation shown in FIG. 8.

The tester 2A contains two input circuits and two output circuits for one signal. The output circuits 2A-1 and 2B-1 output NRZ signals. Wiring lines each having characteristic impedance Zo, a power splitter consisting of three resistors each having resistance Zo/3, and a chip 60 connected to the splitter are mounted on the board 1A.

Rising timing slightly varies between the NRZ signals from the respective output circuits 2A-1 and 2B-1. Similarly, falling timing slightly varies therebetween. The timing differences between these signals are combined with each other by the power splitter 100 to generate a waveform shown in FIG. 8 at an input port of the chip 60. Naturally, by adjusting the voltage, the voltages V1 and V4 can be precisely adjusted. The time TW is also adjustable by adjusting the timing differences.

The power splitter 100 including three resistors of Zo/3 satisfies the matching termination condition to prevent reflection on each end of the resistors.

As above, the polarized RZ signal shown in FIG. 8 can be generated using two output circuits and one power splitter, the signal being adjustable. That is, even by using the NRZ output circuit in the tester 2A, the polarized RZ signal can be generated, and hence the conventional apparatus can be advantageously used.

Figure 13:
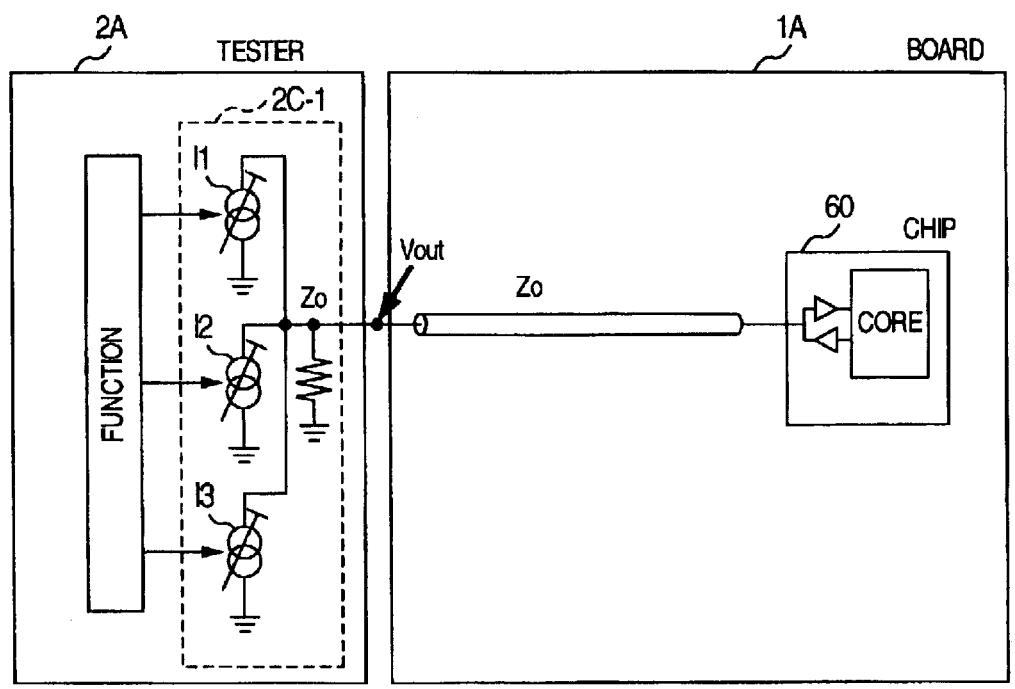
FIG. 13 is a diagram showing a circuit to generate polarized RZ signals.

Also, the polarized RZ signal of FIG. 8 can be generated using a circuit configuration shown in FIG. 13.

Figure 14:
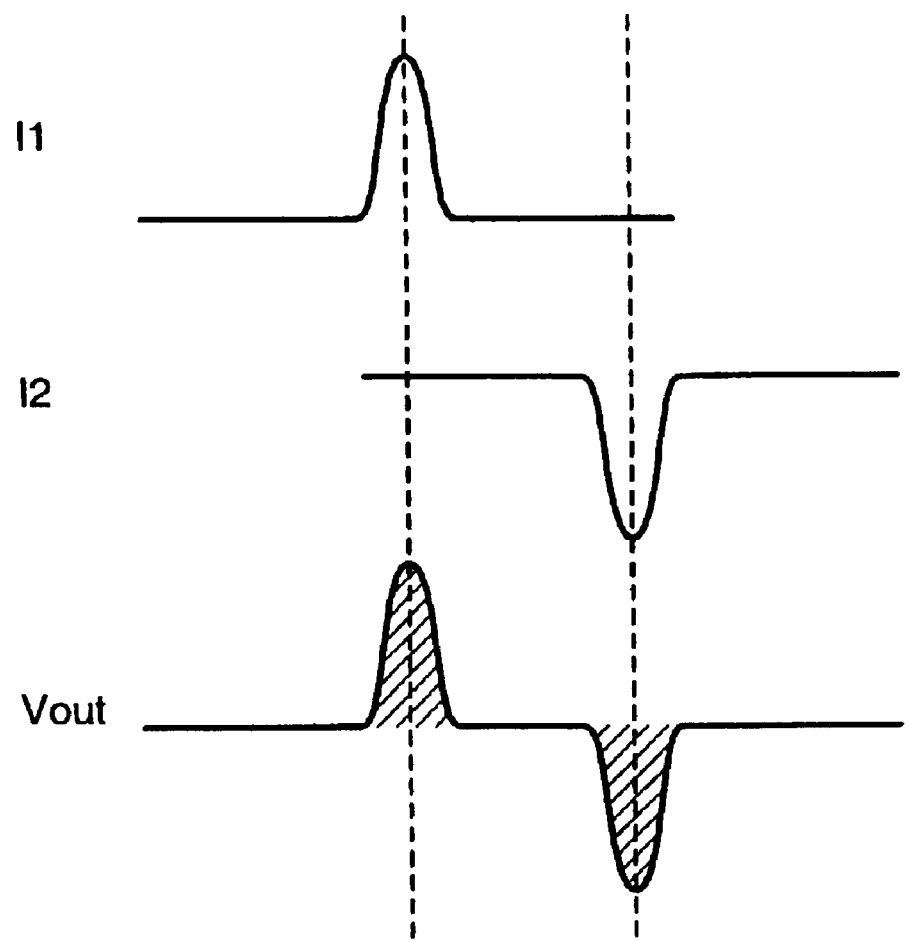
FIG. 14 is a graph showing pulse signals of a current source in an output circuit 2C-1.

The tester 2A includes an output circuit 2C-1 constituting a plurality of current sources and a termination resistor. The termination resistor matches in a wide band with the characteristic impedance Zo of the wiring in the board 1A. Assuming that the current sources in the output circuit 2C-1 are represented as I1, I2, and I3, respectively, since currents can be added to each other to a total current, an output voltage Vout is represented by a product between the total current and the termination resistor. This indicates that an arbitrary voltage waveform can be generated by changing I1, I2, and I3. For example, when I1 is a positive pulse and I2 is a negative pulse as shown in FIG. 14, the polarized RZ signal shown in FIG. 8 can be generated as the voltage Vout at the output port. In this case, the quantity of connecting wiring lines in the board 1A can be advantageously reduced to one half of that of the connecting wiring lines shown in FIG. 14.

Next, a third embodiment of the present invention will be described.

By preparing a board which has passed the test as described in the first embodiment and which has a degree of coupling within a range of specified values and a semiconductor device which has passed the test as described in the second embodiment and which has a hysteresis characteristic within a range of specified values and by installing the semiconductor device on the board, there can be provided a bus system which has a fixed characteristic, i.e., which operates in a stable state and an electronic information system using the bus. The configuration of the system is substantially equal to that shown in FIG. 2. However, since the respective parts are guaranteed as acceptable products, the system conducts a stable operation with high reliability.

The methods of the embodiments lead to advantages as follows.

(1) According to the first embodiment, a board in which a bus is formed using a directional coupler can be tested to determine whether or not each of the characteristic impedance and the degree of coupling of the directional coupler formed in the board is within a range of specified values. Therefore, it is possible to provide a board in which the degree of coupling is within a range of specified values.

(2) According to the second embodiment, a semiconductor chip to be connected to the bus using the directional coupler can be tested to determine whether or not an input circuit having a hysteresis function for a specified voltage and a specified time. Therefore, it is possible to provide a semiconductor device satisfying the standard.

(3) By preparing a board having the effect of (1), namely, a board within a range of specified values and a semiconductor device having the effect of (2), namely, a semiconductor device satisfying the standard and by configuring a product using the board and the semiconductor device, it is possible to manufacture a product which operates in a stable state with high reliability.

According to the present invention, any product associated with a directional coupler can be easily inspected.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A printed board inspecting apparatus for inspecting a printed wiring board including a bus system to transfer data between a first signal line and a second signal line using crosstalk, the first and second signal lines being substantially parallel to each other, comprising:
    a module for inputting a pulse from the first signal line;
    a module for receiving a voltage induced in the second signal line in response to the input pulse inputted; and
    a module for judging whether or not a ratio between a voltage of the input pulse and the voltage induced in the second signal line is within a predetermined range.

2. A printed board inspecting apparatus according to claim 1, further comprising:
    a module for inspecting characteristic impedance according to whether or not a ratio between the voltage of the input pulse and a voltage of a reflection voltage in the first signal line is within a predetermined range; and
    a module for inspecting a degree of coupling indicating a degree of coupling between the first and second signal lines according to whether or not the ratio between the voltage of the input pulse and the voltage induced in the second signal line is within a predetermined range.

3. A printed board inspecting apparatus for inspecting a printed wiring board including a bus system to transfer data between a first signal line and a second signal line using crosstalk, the first and second signal lines being substantially parallel to each other, comprising:
    a module for inputting a pulse from the first signal line;
    a module for inputting a pulse from the second signal line;
    a module for receiving a voltage induced in the first signal line and a voltage induced in the second signal line in response to the input pulses thus inputted; and
    a module for judging whether or not a ratio between a voltage of the input pulse and the associated voltage induced in the first signal line is within a predetermined range and for judging whether or not a ratio between a voltage of the input pulse and the associated voltage induced in the second signal line is within a predetermined range.

4. A printed board inspecting apparatus according to claim 2, wherein
the module for inspecting the degree of coupling:
conducts a conduction test at both ends of the first signal line,
conducts a conduction test at both ends of the second signal line,
conducts an open-circuit test between the first and second signal lines, and
inputs a rectangular pulse from the first signal line and inspects the degree of coupling according to whether or not the ratio between the voltage of the input pulse and the voltage induced in the second signal line is within a predetermined range.

5. A wiring board including a bus system to transfer data between a first signal line and a second signal line using crosstalk, the first and second signal lines being substantially parallel to each other, wherein:
in a case where a pulse is inputted to the first signal line from an inspecting apparatus, a degree of coupling indicative of a degree of coupling the first signal line with the second signal line is present within a predetermined range by causing that a voltage inspected by the inspecting apparatus as a voltage induced on the second signal line in response to the inputted pulse is present within the predetermined range.

6. A wiring board according to claim 5, wherein:
a characteristic impedance of the first signal line is present within the predetermined range by causing a reflection voltage, inspected by the inspecting apparatus as a reflection voltage of the first signal line, to be present within the predetermined range.

7. A wiring board according to claim 6, wherein the degree of coupling is determined to be present within the predetermined range by causing:
a conduction test between both ends of the first signal line with use of the inspecting apparatus;
a conduction test between both ends of the second signal line with use of the inspecting apparatus;
an open-circuit test between the first and second signal lines with use of the inspecting apparatus; and
an input of the pulse into the first signal line from the inspecting apparatus;
wherein a presence of the voltage within the predetermined range is inspected by the inspecting apparatus as the voltage induced on the second signal line.

8. A method of manufacturing a wiring board, comprising the following steps of:
arranging a first signal line and a second signal line on a board, the first and second signal lines being substantially parallel to each other;
inputting a pulse into the first signal line from the inspecting apparatus;
receiving a voltage induced on the second signal line from the second signal line to the inspecting apparatus in response to the inputted pulse; and
judging whether or not the voltage induced on the second signal line is present within a predetermined range, to inspect a degree of coupling indicative of a degree of coupling the first signal line with the second signal line in response to a result of the judging.

9. A method of manufacturing a wiring board according to claim 8, further comprising the steps of:
judging whether or not a reflection voltage of the first signal line is present within the predetermined range, by the inspecting apparatus, and inspecting characteristic impedance of the first signal line in response to a result of the judging.

10. A method of manufacturing a wiring board according to claim 9, wherein the step of inspecting the degree of coupling comprises the steps of:
conducting a conduction test at both ends of the first signal line by the inspecting apparatus,
conducting a conduction test at both ends of the second signal line by the inspecting apparatus,
conducting an open-circuit test between the first and second signal lines by the inspecting apparatus, and
inputting a pulse from the inspecting apparatus to the first signal line,
judging whether or not the voltage induced on the second signal line is present in the predetermined range by the inspecting apparatus, and
inspecting the degree of coupling in accordance with the result of the judging.

11. A semiconductor chip inspecting apparatus for inspecting a semiconductor chip for a bus system transferring data via a directional coupler, the chip including a hysteresis input circuit, wherein:
a core circuit is inspected by inputting an NRZ signal to the hysteresis input circuit; and wherein
when the core circuit is an acceptable item as a result of the inspection, the hysteresis input circuit is inspected by inputting an RZ signal to the hysteresis input circuit.

12. A semiconductor chip inspecting apparatus for inspecting a semiconductor chip for a bus system transferring data via a directional coupler, the chip including an input circuit in which a change-over operation can be conducted between a hysteresis input circuit and an NRZ input circuit, wherein:
a core circuit is inspected by conducting a change-over operation of the input circuit to the NRZ input circuit and by inputting an NRZ signal thereto; and wherein
when the core circuit is an acceptable item as a result of the inspection, the hysteresis input circuit is inspected by conducting a change-over operation of the input circuit to the hysteresis input circuit and by inputting an RZ signal thereto.

13. A method of manufacturing a semiconductor device, comprising the following steps of:
forming a hysteresis input circuit on a semiconductor wafer;
inspecting a core circuit by inputting an NRZ signal to the hysteresis input circuit; and
inspecting, when the core circuit is an acceptable item as a result of the inspection, the hysteresis input circuit by inputting an RZ signal to the hysteresis input circuit of the acceptable item.

14. A method of manufacturing a semiconductor device, comprising the following steps of:
forming an input circuit on a semiconductor wafer in which a change-over, operation can be conducted between a hysteresis input circuit and an NRZ input circuit;
inspecting a core circuit by conducting a change-over operation of the input circuit to the NRZ input circuit and by inputting an NRZ signal thereto; and inspecting, when the core circuit is an acceptable item as a result of the inspection, the hysteresis input circuit by conducting a change-over operation of the input circuit to the hysteresis input circuit and by inputting an RZ signal thereto.

15. A semiconductor device including a bus system interface circuit using a directional coupler, comprising:
a core circuit; and
a hysteresis input circuit for the interface circuit, wherein
the core circuit is inspected by inputting an NRZ signal to the hysteresis input circuit; and wherein
when the core circuit is an acceptable item as a result of the inspection, the hysteresis input circuit is inspected by inputting an RZ signal to the hysteresis input circuit of the acceptable item.

16. A semiconductor device including a bus system interface circuit using a directional coupler, comprising:
a core circuit; and
an input circuit in which a change-over operation can be conducted between a hysteresis input circuit for the interface circuit and an NRZ input circuit, wherein:
the core circuit is inspected by conducting a change-over operation of the input circuit to the NRZ input circuit and by inputting an NRZ signal thereto; and wherein
the hysteresis input circuit is inspected, when the core circuit is an acceptable item as a result of the inspection, by conducting a change-over operation of the input circuit to the hysteresis input circuit and by inputting an RZ signal thereto.

17. A bus system for transferring data between a first signal line and a second signal line both arranged in parallel using crosstalk, comprising,
a printed board inspecting apparatus, including:
a module for inputting a pulse from the first signal line;
a module for receiving a voltage induced in the second signal line in response to the input pulse inputted;
a module for judging whether or not a ratio between a voltage of the input pulse and the voltage induced in the second signal line is within a predetermined range;
a module for inspecting characteristic impedance according to whether or not a ratio between the voltage of the input pulse and a voltage of a reflection voltage in the first signal line is within a predetermined range, thereby conducting a conduction test at both ends of the first signal line, conducting a conduction test at both ends of the second Signal line, conducting an open-circuit test between the first and second signal lines, inputting a rectangular pulse from the first signal line, and inspecting a degree of coupling between the first and second signal lines in accordance with whether or not the ratio between the voltage of the input pulse and the voltage induced in the second signal line is within a predetermined range, to obtain an acceptable printed board;
a semiconductor device, including:
a bus system interface circuit using a directional coupler; a core circuit including other circuits except for an externally located circuit and a signal input and output circuit; and a hysteresis input circuit for the interface circuit, wherein
the core circuit is inspected by inputting an NRZ signal to the hysteresis input circuit, and according to a result of the inspection, when the core circuit is acceptable, the hysteresis input circuit is inspected by inputting an RZ signal to the hysteresis input circuit, to obtain an acceptable semiconductor device, and wherein
the semiconductor device is mounted on the printed board inspecting apparatus.

18. A bus system according to claim 17, wherein a plurality of semiconductor devices are mounted on the printed board inspecting apparatus.

* * * * *